(12) United States Patent
Arvin et al.

(10) Patent No.: US 10,224,273 B2
(45) Date of Patent: Mar. 5, 2019

(54) MULTI TERMINAL CAPACITOR WITHIN INPUT OUTPUT PATH OF SEMICONDUCTOR PACKAGE INTERCONNECT

(71) Applicant: International Business Machines Corporation, Armonk, NY (US)

(72) Inventors: Charles L. Arvin, Poughkeepsie, NY (US); Jean Audet, Québec (CA); Brian W. Quinlan, Poughkeepsie, NY (US); Charles L. Reynolds, Red Hook, NY (US); Brian R. Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/796,770

(22) Filed: Oct. 28, 2017

(65) Prior Publication Data

US 2018/0053717 A1 Feb. 22, 2018

Related U.S. Application Data

(62) Division of application No. 15/207,077, filed on Jul. 11, 2016, now Pat. No. 9,899,313.

(51) Int. Cl.
*H01L 23/00* (2006.01)
*H01L 23/50* (2006.01)
(Continued)

(52) U.S. Cl.
CPC .... *H01L 23/5223* (2013.01); *H01L 23/49816* (2013.01); *H01L 23/49822* (2013.01);
(Continued)

(58) Field of Classification Search
None
See application file for complete search history.

(56) References Cited

U.S. PATENT DOCUMENTS 6,509,646 B1 1/2003 Lin et al.
6,884,939 B2 4/2005 Dishongh et al.
(Continued)

FOREIGN PATENT DOCUMENTS

JP 2006049720 A 2/2006
JP 4571487 B2 10/2010
(Continued)

OTHER PUBLICATIONS

B. Dang, et al., "3D Chip Stack with Integrated Decoupling Capacitors", IEEE, Electronic Components and Technology Conference, 2009, p. 1-5.

(Continued)

*Primary Examiner* — Whitney Moore
(74) *Attorney, Agent, or Firm* — ZIP Group PLLC

(57) ABSTRACT

A semiconductor package, e.g., wafer, chip, interposer, etc., includes a multi terminal capacitor within an input output (IO) path. The multi terminal capacitor is electrically attached directly upon a first IO contact of the semiconductor package. There is no inductance between the multi terminal capacitor and a interconnect that electrically connects the first IO contact with a second IO contact of a second semiconductor package and no inductance between the multi terminal capacitor and the first IO contact. The multi terminal capacitor may serve as a power source to cycle the turning on and off of the various circuits within a semiconductor chip associated with the semiconductor package. Because the distance between the multi terminal capacitor and semiconductor chip is reduced, inductance within the system is resultantly reduced. The multi terminal capacitor may be a decoupling capacitor that decouples one (Continued)

part of semiconductor chip from another part of semiconductor chip.

10 Claims, 8 Drawing Sheets

(51) Int. Cl.
  *H01L 25/18* (2006.01)
  *H01L 23/367* (2006.01)
  *H01L 23/498* (2006.01)
  *H01L 23/522* (2006.01)

(52) U.S. Cl.
  CPC ........ *H01L 23/49894* (2013.01); *H01L 23/50* (2013.01); *H01L 24/17* (2013.01); *H01L 24/48* (2013.01); *H01L 23/3675* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 25/18* (2013.01); *H01L 2224/13101* (2013.01); *H01L 2224/16225* (2013.01); *H01L 2224/2919* (2013.01); *H01L 2224/32225* (2013.01); *H01L 2224/73204* (2013.01); *H01L 2224/73253* (2013.01); *H01L 2224/81815* (2013.01); *H01L 2924/15311* (2013.01); *H01L 2924/16152* (2013.01); *H01L 2924/19103* (2013.01); *H01L 2924/19107* (2013.01)

(56) References Cited

U.S. PATENT DOCUMENTS

| | | | |
|---|---|---|---|
| 6,894,385 B1 | 5/2005 | Jafari et al. | |
| 7,378,733 B1 | 5/2008 | Hoang et al. | |
| 7,622,325 B2 | 11/2009 | Shim et al. | |
| 7,696,006 B1 | 4/2010 | Hoang et al. | |
| 7,773,390 B2 | 8/2010 | Weir et al. | |
| 7,968,375 B1 | 6/2011 | Rahman et al. | |
| 7,973,383 B2 | 7/2011 | Furumiya et al. | |
| 8,697,567 B2 | 4/2014 | Henderson et al. | |
| 8,806,420 B2 | 8/2014 | Chan et al. | |
| 9,219,039 B2 | 12/2015 | Kuo et al. | |
| 9,263,186 B2 | 2/2016 | Li et al. | |
| 2006/0180938 A1 | 8/2006 | Kurihara et al. | |
| 2011/0090662 A1 | 4/2011 | Jang et al. | |
| 2012/0181648 A1* | 7/2012 | Andry ........ | H01L 21/6835 257/434 |
| 2014/0185264 A1 | 7/2014 | Chen et al. | |
| 2015/0255360 A1 | 9/2015 | Hsu et al. | |
| 2015/0311275 A1 | 10/2015 | Song et al. | |
| 2016/0260693 A1 | 9/2016 | Lin et al. | |

FOREIGN PATENT DOCUMENTS

| | | |
|---|---|---|
| KR | 1020120088013 A | 8/2012 |
| WO | 2016004245 A1 | 1/2016 |

OTHER PUBLICATIONS

Y. Min, et al., "Embedded Capacitors in the Next Generation Processor", IEEE, Electronic Components & Technology Conference, 2013, pp. 1-5.

Flip Chip Assembly With Conneted Component, U.S. Appl. No. 14/969,765, filed Dec. 15, 2015.

List of IBM Patents or Patent Applications Treated as Related, dated herewith.

* cited by examiner

MULTI TERMINAL CAPACITOR WITHIN INPUT OUTPUT PATH OF SEMICONDUCTOR PACKAGE INTERCONNECT

FIELD

Embodiments of invention generally relate to semiconductor devices and semiconductor device fabrication methods. More particularly, embodiments relate to a multi terminal capacitor within an input output (I/O) path of a semiconductor package interconnect.

BACKGROUND

As clock speeds and the circuit densities of semiconductor chips have increased, degraded electrical performance of the semiconductor chips has been seen due to high frequency noise and inductance. One such cause of noise and inductance is related to the rapid turning on and off of circuits within the semiconductor chip. Prior semiconductor chips may have utilized the power supply of the associated electronic device as a power source to cycle the turning on and off of the various circuits within the chip. Because the distance between the power supply and semiconductor chip is usually orders of magnitude larger than the lengths of the circuits within the semiconductor chip, a large inductance was introduced into the system. Likewise, the turning on and off of an increasingly large number of circuits within the semiconductor chip also results in an increasing amount of noise. Therefore, there is a need to reduce inductance and noise within semiconductor chips.

SUMMARY

In an embodiment of the present invention, a semiconductor chip system is presented. The semiconductor chip system includes a semiconductor chip electrically connected to a chip carrier via first input output (IO) interconnects within a first interconnect level. The semiconductor chip system also includes a carrier interposer electrically connected to the chip carrier via second IO interconnects within a second interconnect level and electrically connected to a mother board via third IO interconnects within a third interconnect level. The semiconductor chip system also includes a multi terminal capacitor within the second interconnect level such that there is no inductance between a first solder interconnect within the second interconnect level and a first terminal of the multi terminal capacitor and between the first solder interconnect and a first IO contact of the chip carrier.

In an embodiment of the present invention, a semiconductor chip system is presented. The semiconductor chip system includes a semiconductor chip electrically connected to a chip carrier via first input output (IO) interconnects within a first interconnect level. The semiconductor chip system also includes a carrier interposer electrically connected to the chip carrier via second IO interconnects within a second interconnect level and electrically connected to a mother board via third IO interconnects within a third interconnect level. The semiconductor chip system also includes a multi terminal capacitor within the second interconnect level such that there is no inductance between a first solder interconnect within the second interconnect level and a first terminal of the multi terminal capacitor and between the first solder interconnect and a first IO contact of the carrier interposer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures or methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to one or more semiconductor packages, such as a semiconductor wafer, semiconductor chip, interposer, etc., that include one or more multi terminal capacitors within an input output (IO) path of a semiconductor package interconnect. More particularly, the multi terminal capacitor is electrically attached directly upon neighboring IO contacts of the semiconductor package such that there is no inductance at least between the multi terminal capacitor and the interconnect that electrically connects an IO contact of a first semiconductor package and an IO contact of a second semiconductor package. The multi terminal capacitor may serve as a power source to cycle the turning on and off of the various circuits within a semiconductor chip associated with the semiconductor package. Because the distance between the multi terminal capacitor and semiconductor chip is reduced, inductance within the system is resultantly reduced. In addition, the multi terminal capacitor may be a decoupling capacitor that decouples one part of semiconductor chip from another part of semiconductor chip so as to reduce noise within the system.

Referring now to the FIGs, wherein like components are labeled with like numerals, exemplary fabrication steps and corresponding structure in accordance with embodiments of the present invention are shown, and will now be described in greater detail below. It should be noted that some of the FIGs depict cross section views. Furthermore, it should be noted that while this description may refer to components in the singular tense, more than one component may be depicted throughout the figures or a real world implementation of the embodiments of the present invention. The specific number of components depicted in the figures and the particular view was chosen to best illustrate the various embodiments described herein.

Figure 1:
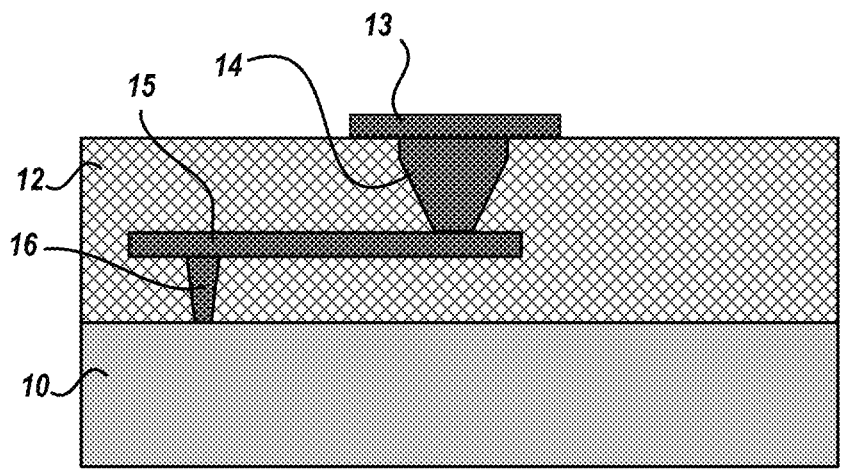
FIG. 1 depicts an exemplary semiconductor package that may utilize various embodiments of the present invention.

FIG. 1 depicts an exemplary semiconductor package 20 that may utilize various embodiments of the present invention. In embodiments, semiconductor package 20 is a data handling device such as a semiconductor chip, integrated circuit, processor, coprocessor, application specific integrated circuit (ASIC), field programmable gate array (FPGA), or the like. In some embodiments, semiconductor package 20 may take its raw form as a pre-diced wafer from which multiple semiconductor packages 20 are fabricated and subsequently diced into individual semiconductor packages 20. Semiconductor package 20 includes a substrate 10, one or more dielectric layers 12, and IO contact 13. In the example depicted in FIG. 1, one or more dielectric layers 12 are formed upon a semiconductor substrate 12. For example, as is known in the art, various front end of the line (FEOL), middle end of the line (MEOL), and back end of the line (BEOL) fabrication processes may form mirco-electronic devices within or upon substrate 10. The substrate 10 may be, for example, silicon or other known substrates for the formation of semiconductor package 20. A metal, or otherwise electrically conductive, interconnect 16 and wiring line 15 may be formed in the one or more dielectric layers 12 using conventional damascene and deposition processes. The interconnect 16 is generally electrically connected to one or more micro-devices, such as a transistor. A metal, or otherwise electrically conductive, inter dielectric contact 14 may be formed in the dielectric layers 12 and is in contact with wiring line 15. Likewise, a metal, or otherwise electrically conductive, IO contact 13 may be formed upon inter dielectric contact 14 and upon dielectric layers 12 to service as a interconnect structure to electrically connect semiconductor package 20 to another electronic device or semiconductor package.

Figure 2:
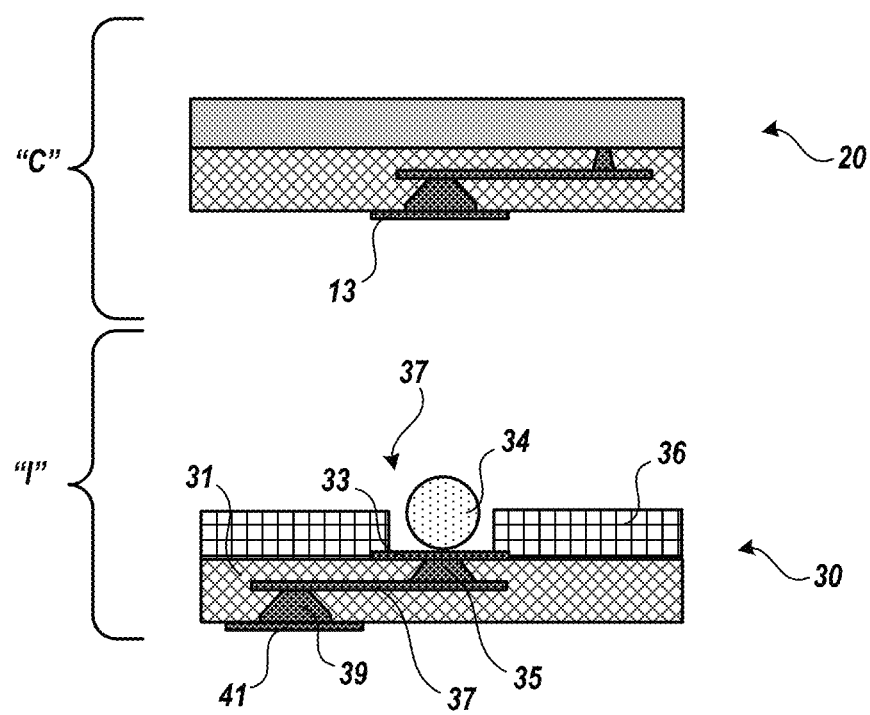
FIG. 2 depicts multiple exemplary semiconductor packages that may utilize various embodiments of the present invention.

FIG. 2 depicts exemplary semiconductor package 20 and semiconductor package 30 that may utilize various embodiments of the present invention. In the present multi semiconductor package embodiment, semiconductor package 20 is in the form of an individual processing device, as opposed to the raw wafer, and is denoted as a semiconductor chip "C." Semiconductor package 30 is generally an interposer, carrier, or the like and is denoted as an interposer "I."

Semiconductor package 30 may be an organic carrier or a ceramic carrier and may be generally connected to a first interconnect level and provides mechanical support for semiconductor package 20 and electrical paths from the upper surface of semiconductor package 30 to the bottom side of semiconductor package 30. The term "first interconnect level" is utilized herein to denote a first IO connection interface between the data processing semiconductor package 20 and the semiconductor package 30. In a particular embodiment, the upper side of semiconductor package 30 is electrically connected to semiconductor package 20. The bottom side of semiconductor package 30 may be electrically connected to an electronic device mother board or a mother board interposer such as a riser board, daughter board, etc. The side of semiconductor package 30 opposing semiconductor package 20 may be generally connected to a second interconnect level. The term "second interconnect level" is utilized herein to denote a second IO connection interface from the semiconductor package 30 to another electronic device component.

Semiconductor package 30 may include a substrate 31, IO contact 33, inter substrate contact 35, wiring line 37, inter substrate contact 39, and IO contact 41. Substrate 31 may be an organic, ceramic, or other known carrier material within which electrical pathways may be fabricated and upon which IO contacts may be fabricated. The IO contact 33, inter substrate contact 35, wiring line 37, inter substrate contact 39, and IO contact 41 may generally form electrical paths from the top surface of semiconductor package 30 to the bottom surface of semiconductor package 30.

In embodiments of the invention, solder mask 36 and solder 34 may be connected semiconductor package 20 or semiconductor package 30. Solder mask 36 is a layer of dielectric (e.g. polymer, etc.) that is formed upon the respective surfaces of semiconductor package 20 and/or semiconductor package 30 and prevents solder bridges from forming between closely spaced IO contacts. Solder mask 36 includes openings 37 that expose the underlying IO contact. Solder 34 is populated within the openings 37 and contacts the exposed IO contact. Solder 34 generally is a grid array type solder and generally electrically connects IO contacts of semiconductor package 20 with IO contacts of semiconductor package 30 at the first interconnect level and generally electrically connects IO contacts of semiconductor package 30 with IO contacts of another electronic device at the second interconnect level.

At the first interconnect level, the solder 34 is generally C4 (controlled collapse chip connection) type solder. At the second interconnect level, the solder 34 is generally micro BGA (ball grid array) type solder balls. The term "micro BGA" is utilized herein to denote BGA solder balls of the micron scale which have a diameter of approximately 120 microns to 300 microns and are spaced at a pitch of approximately 200 microns to 800 microns. Generally, size of the second interconnect level solder 34 is greater than the size of the first interconnect level solder 34. For example, the space between the semiconductor package 20 and semiconductor package 30 may be approximately 10 to 100 microns and the space between the semiconductor package 30 and the other electronic device component connected thereto may be approximately 100 to 500 microns.

It is contemplated C4 type solder 34 be included upon contact 13 of semiconductor package 20 or upon contact 33 of semiconductor package 30. Micro BGA type solder 34 be included upon contact 33 of semiconductor package 30 or upon respective contacts of the other electronic device. Therefore, in embodiments, some IO contacts can be completely devoid of any solder 34 and still be joined to IO contacts of another semiconductor package or electronic device.

Figure 3:
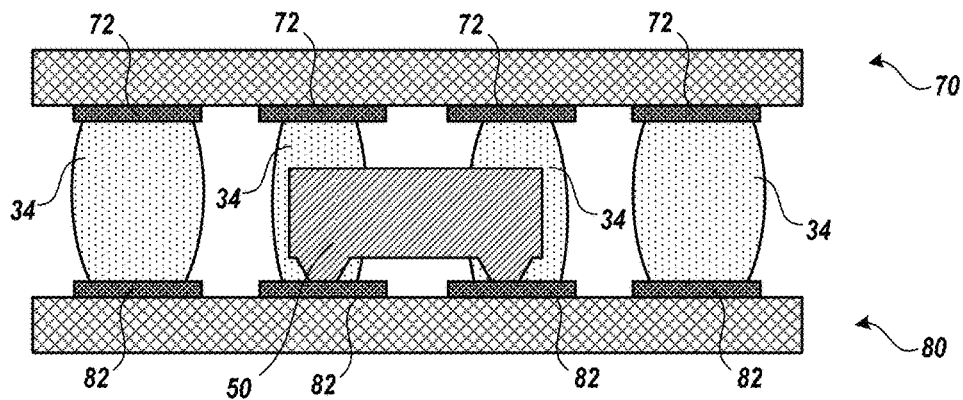
FIG. 3-FIG. 5 depict cross section views of exemplary multi terminal capacitors within an input output (IO) path of a multi semiconductor package interconnect, according to various embodiments of the present invention.
Figure 4:
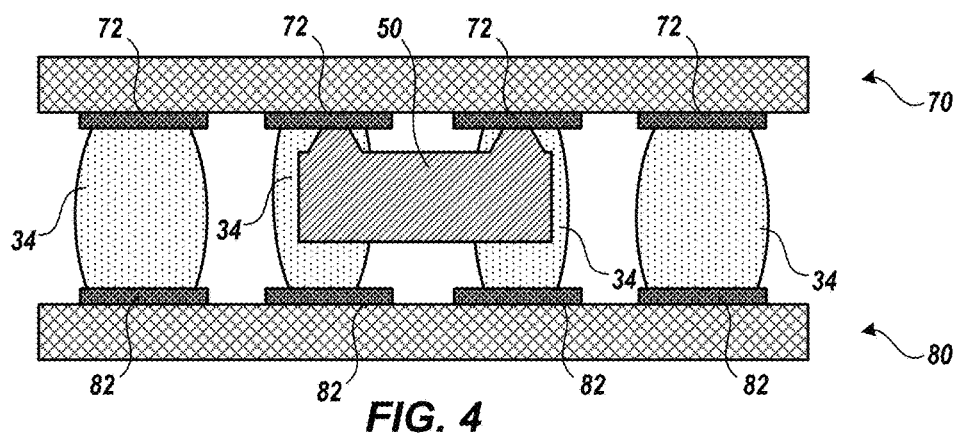
Figure 5:
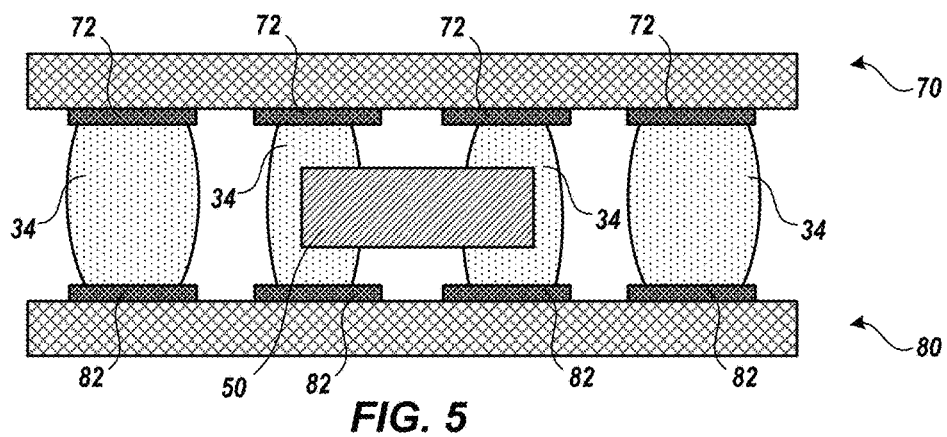

FIG. 3-FIG. 5 depict cross section views of an exemplary multi terminal capacitor 50 within an IO path of a multi semiconductor package interconnect, according to various embodiments of the present invention. For example, FIG. 3 depicts multi terminal capacitor 50 attached within the joint created by solder 34 which connects respective IO contacts 82 of a lower semiconductor package 80 with respective IO contacts 72 of an upper semiconductor package 70. Similarly, FIG. 4 depicts multi terminal capacitor 50 attached to at least two IO contacts 72 of an upper semiconductor package 70 within an IO electrical pathway of an interconnect level that electrically connects IO contacts 72 with respective IO contacts 82 of a lower semiconductor package 80. FIG. 5 depicts multi terminal capacitor 50 attached within an IO electrical pathway of an interconnect level that electrically connects IO contacts 72 of an upper semiconductor package 70 with respective IO contacts 82 of a lower semiconductor package 80.

Generally, upper semiconductor package 70 may be semiconductor package 20 or semiconductor package 30. Lower semiconductor package 80 may, therefore, be semiconductor package 30 if upper semiconductor package 70 is semiconductor package 20 or may be another electronic device if upper semiconductor package 70 is semiconductor package 30. If solder 34 is associated with the first interconnect level, the distance between the upper semiconductor package 70 and lower semiconductor package 80 is smaller than the distance between the upper semiconductor package 70 and lower semiconductor package 80 if solder 34 is associated with the second interconnect level. As such, the height of multi terminal capacitor 50 may be larger if located in the second interconnect level as opposed to multi terminal capacitor 50 being located in the first interconnect level. Consequently, the electrical potential of the multi terminal capacitor 50 within the second interconnect level may be greater than the electrical potential of the multi terminal capacitor 50 within the first interconnect level.

The views of FIG. 3-FIG. 5 depict solder 34 subsequent to a solder reflow fabrication stage of a multi semiconductor package wherein solder 34 is reflowed such that solder 34 wets to IO contact 72 and IO contact 82 forming a bond between solder 34, IO contact 72, and IO contact 82. At least two IO pathways between upper semiconductor package 70 and lower semiconductor package 80 include multi terminal capacitor 50 and, as such, the associated solder 34 wets to IO contact 72, IO contact 82, and a terminal of multi terminal capacitor 50 forming a bond between solder 34, IO contact 72, IO contact 82, and a respective terminal of multi terminal capacitor 50.

FIG. 3 depicts an embodiment of the multi semiconductor package where the multi terminal capacitor 50 is connected directly to the solder 34 of the IO path, bypassing the internal wiring of the lower semiconductor package 80 and the upper semiconductor package 70. The direct connection of multi terminal capacitor 50 to the solder 34 eliminates induction that otherwise would exist from the internal wiring.

FIG. 4 depicts an embodiment of the multi semiconductor package where no inductance exists between the multi terminal capacitor 50 and IO contacts 72 of upper semiconductor package 70 and between the multi terminal capacitor 50 and solder 34 which electrically connects upper semiconductor package 70, lower semiconductor package 80, and multi terminal capacitor 50.

FIG. 5 depicts an embodiment of the multi semiconductor package where no inductance exists between the multi terminal capacitor 50 and solder 34 which electrically connects upper semiconductor package 70, lower semiconductor package 80, and multi terminal capacitor 50.

For clarity, no additional inductance is introduced in the multi semiconductor packages depicted in FIG. 3-FIG. 5 between the upper semiconductor package 70 and lower semiconductor package 80 due to the addition of multi terminal capacitor 50 within particular IO pathways. For example, the inductance between IO contacts 72 and IO contacts 82 are the same. Further, no additional inductance is introduced in the multi semiconductor packages depicted in FIG. 3-FIG. 5 associated with an increased length of an electrical pathway of the upper semiconductor package 70 or the lower semiconductor package that connects an associated IO contact to power or ground. In other words, an equivalent circuit length between any of the IO contacts of the upper semiconductor package 70 and or lower semiconductor package 80 and power or ground is the same whether or not multi terminal capacitor 50 is connected to the IO contact. For clarity, such equivalent circuit length does not change because multi terminal capacitor 50 is electrically connected within the first and/or second interconnect levels which allows the length of all of the electrical pathways within upper semiconductor package 70 and or lower semiconductor package 80 to stay constant whether or not multi terminal capacitor 50 is associated with the pathway.

Figure 6:
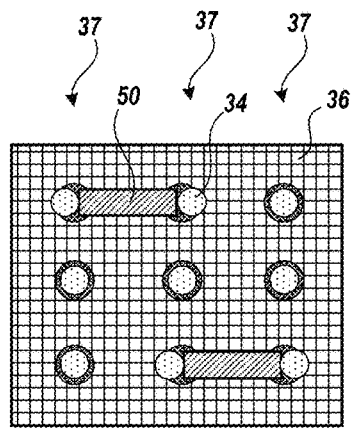
FIG. 6-FIG. 8 depict normal views of exemplary multi terminal capacitors upon a semiconductor package, according to various embodiments of the present invention.
Figure 7:
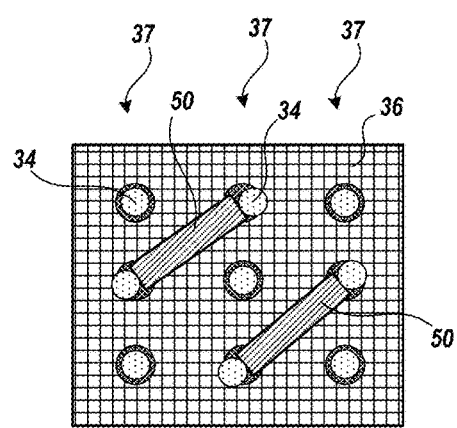
Figure 8:
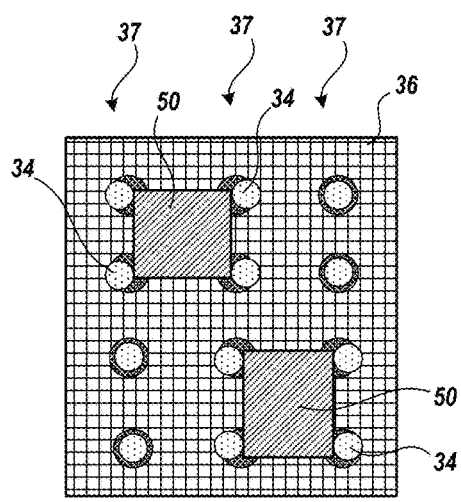

FIG. 6-FIG. 8 depict normal views of exemplary multi terminal capacitors 50 upon a semiconductor package, according to various embodiments of the present invention. For example, FIG. 6 depicts multi terminal capacitor 50 attached to horizontally neighboring IO contacts of a semiconductor package, FIG. 7 depicts multi terminal capacitor 50 attached to diagonal neighboring IO contacts of a semiconductor package, and FIG. 8 depicts multi terminal capacitor 50 attached to horizontally neighboring IO contacts and to vertically neighboring IO contacts of a semiconductor package.

The term "neighboring IO contacts" is defined as directly adjacent IO contacts with no intermediate IO contacts therebetween. For clarity, the orientation of the semiconductor package depicted in FIG. 6 may be such that terminal capacitor 50 is attached to vertically neighboring IO contacts of the semiconductor package. Generally, neighboring IO contacts each separately located in different columns or rows of the IO contact array are of opposite polarity. In other words, successive rows or columns of IO contacts are each associated with an alternating positive and negative polarity. For example, in FIG. 6, the bottom row of IO contacts may be associated with a positive polarity, the middle row of IO contacts is then associated with a negative polarity, and the top row of IO contacts is then associated with a positive polarity.

Due to multi terminal capacitor 50 being electrically connected within the first and/or second interconnect levels and by and within solder 34, particular solder 34 of the solder array need not be depopulated in particular opening 37 locations from the solder mask 36 associated with where multi terminal capacitor 50 are or are to be placed. In other words, the entire solder 34 grid array may stay intact as opposed to particular locations of solder 34 needing to be removed in locations where multi terminal capacitor 50 is or is to be placed.

Figure 9:
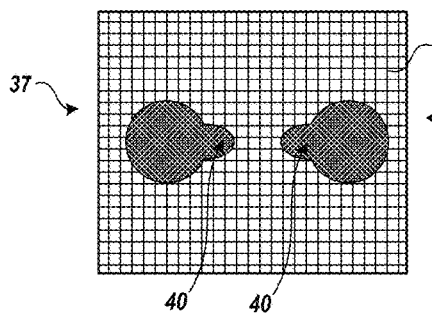
FIG. 9 depicts a normal view of an exemplary semiconductor package solder mask and exposed contacts, according to various embodiments of the present invention.

FIG. 9 depicts a normal view of an exemplary semiconductor package solder mask 36 and IO contacts exposed by arrayed openings 37 within the solder mask 36. In an embodiment, solder mask 36 opening 37 includes capacitor tab 40. The term "capacitor tab" is defined as an extension of an associated opening 37 that directionally extends toward a neighboring extension of a neighboring opening 37 such that the extension increases the exposed area of an IO contact that is exposed by associated opening 37. For example, capacitor tab 40 of the left opening 37 directionally (i.e., horizontally) extends toward capacitor tab 40 of the neighboring right opening 37, and vice versa, as depicted in FIG. 9. The term "neighboring openings" is defined as directly adjacent openings 37 within solder mask 36 with no intermediate openings 37 therebetween.

Figure 10:
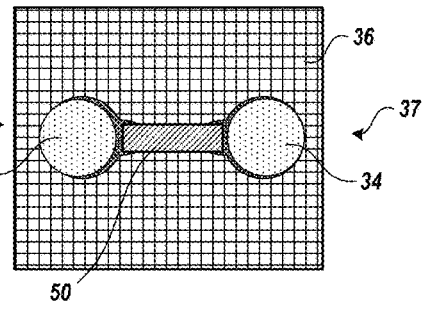
FIG. 10 depicts a normal view of an exemplary multi terminal capacitor upon semiconductor package exposed contacts, according to various embodiments of the present invention.

FIG. 10 depicts a normal view of an exemplary multi terminal capacitor 50 upon exposed IO contacts of a semiconductor package. In an embodiment, each terminal of the multi terminal capacitor 50 generally contacts an IO contact exposed via opening 37 of solder mask 36 within the boundary of a respective capacitor tab 40. For example, a left terminal of multi terminal capacitor 50 contacts the IO contact exposed by capacitor tab 40 of the left opening 37 and a right terminal of multi terminal capacitor 50 contacts the IO contact exposed by capacitor tab 40 of the right opening 37. The increase of exposed area of the IO contact by the capacitor tab 40 allows requisite area for a terminal of the multi terminal capacitor 50 to electrically connect with the IO contact (via a particular reflowed solder 34) while also allowing the area of the IO contact exposed by opening 37 to be maintained so as to not degrade IO signal characteristics associated therewith.

Figure 11:
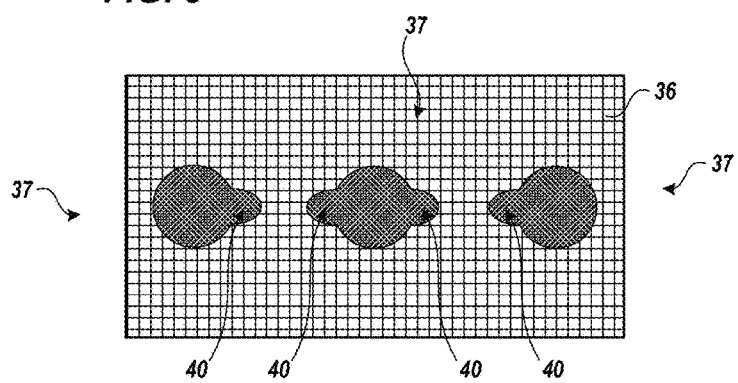
FIG. 11 depicts a normal view of an exemplary semiconductor package solder mask and exposed contacts, according to various embodiments of the present invention.

FIG. 11 depicts a normal view of an exemplary semiconductor package solder mask 36 and IO contacts exposed by openings 37 within the solder mask 36. In an embodiment, at least two solder mask 36 openings 37 include one respective capacitor tab 40 and one solder mask 36 opening 37 includes two capacitor tabs 40. For example, a left and right opening 37 each respectively includes one capacitor tab 40 and a middle opening 37 includes a left capacitor tab 40 and a right capacitor tab 40. The multiple capacitor tabs 40 are arranged such that the capacitor tab 40 of the left opening 37 directionally (i.e., horizontally) extends toward the left capacitor tab 40 of the neighboring middle opening 37, and vice versa, and such that the capacitor tab 40 of the right opening 37 directionally (i.e., horizontally) extends toward the right capacitor tab 40 of the neighboring middle opening 37, and vice versa.

Figure 12:
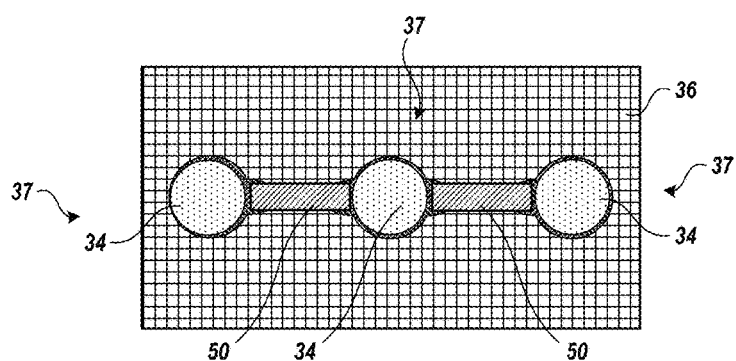
FIG. 12 depicts a normal view of exemplary multi terminal capacitors upon semiconductor package exposed contacts, according to various embodiments of the present invention.

FIG. 12 depicts a normal view of multiple exemplary multi terminal capacitors 50 upon exposed IO contacts of a semiconductor package. In an embodiment, each terminal of the multi terminal capacitor 50 generally contacts an IO contact exposed via opening 37 of solder mask 36 within the boundary of a respective capacitor tab 40. For example, a left terminal of a first multi terminal capacitor 50 contacts the IO contact exposed by capacitor tab 40 of the left opening 37 and a right terminal of the first multi terminal capacitor 50 contacts the IO contact exposed by the left capacitor tab 40 of the middle opening 37 Likewise, a left terminal of a second multi terminal capacitor 50 contacts the IO contact exposed by right capacitor tab 40 of the middle opening 37 and a right terminal of the second multi terminal capacitor 50 contacts the IO contact exposed by the capacitor tab 40 of the right opening 37. The increase of exposed area of the IO contact by the one or more capacitor tab(s) 40 allows requisite area for a terminal of the multi terminal capacitor 50 to electrically connect with the IO contact (via a particular reflowed solder 34) while also allowing the area of the IO contact exposed by opening 37 to be maintained so as to not degrade IO signal characteristics associated therewith.

Figure 13:
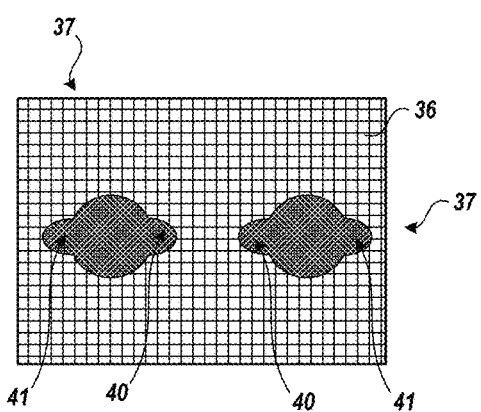
FIG. 13 depicts a normal view of an exemplary semiconductor package solder mask and exposed contacts, according to various embodiments of the present invention.

FIG. 13 depicts a normal view of an exemplary semiconductor package solder mask 36 and IO contacts exposed by openings 37 within the solder mask 36. In an embodiment, solder mask 36 opening 37 includes capacitor tab 40 and signal tab 41. The term "signal tab" is defined as an extension of an associated opening 37 that extends in an opposite direction from the capacitor tab 40 of the associated opening 37 such that the extension increases the exposed area of an IO contact that is exposed by the associated opening 37. For example, signal tab 41 of the left opening 37 directionally (i.e., horizontally) extends away from capacitor tab 40 of the left opening 37 such that signal tab 41 extends in a direction 180° from direction of capacitor tab 40 of the left opening 37. Likewise, signal tab 41 of the right opening 37 directionally (i.e., horizontally) extends away from capacitor tab 40 of the right opening 37 such that signal tab 41 extends in a direction 180° from direction of capacitor tab 40 of the right opening 37.

Figure 14:
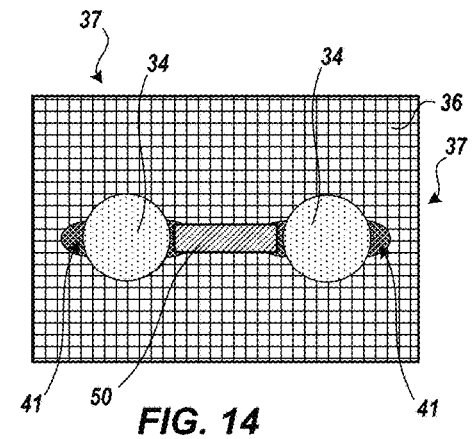
FIG. 14 depicts a normal view of an exemplary multi terminal capacitor upon semiconductor package exposed contacts, according to various embodiments of the present invention.

FIG. 14 depicts a normal view of an exemplary multi terminal capacitor 50 upon exposed IO contacts of a semiconductor package. In an embodiment, each terminal of the multi terminal capacitor 50 generally contacts an IO contact exposed via opening 37 of solder mask 36 within the boundary of a respective capacitor tab 40. For example, a left terminal of multi terminal capacitor 50 contacts the IO contact exposed by capacitor tab 40 of the left opening 37 and a right terminal of multi terminal capacitor 50 contacts the IO contact exposed by capacitor tab 40 of the right opening 37. The increase of exposed area of the IO contact by the capacitor tab 40 allows requisite area for a terminal of the multi terminal capacitor 50 to electrically connect with the IO contact (via a particular reflowed solder 34) while the increase of exposed area of the IO contact by the signal tab 41 allows requisite area of the IO contact to be maintained so as to not degrade IO signal characteristics associated therewith. In other words, solder 34 wets to the IO contact within the area of opening 37 and within the area of signal tab 41 so as to obtain a sufficient area of electrical connection between the solder 34 and the IO contact so as to achieve sufficient IO signal characteristics associated therewith.

For clarity, some openings 37 of solder mask 36 may include one or more capacitor tabs 40 and one or more signal tabs 41 while other openings 37 may not include any capacitor tabs 40 and any signal tabs 41.

Figure 15:
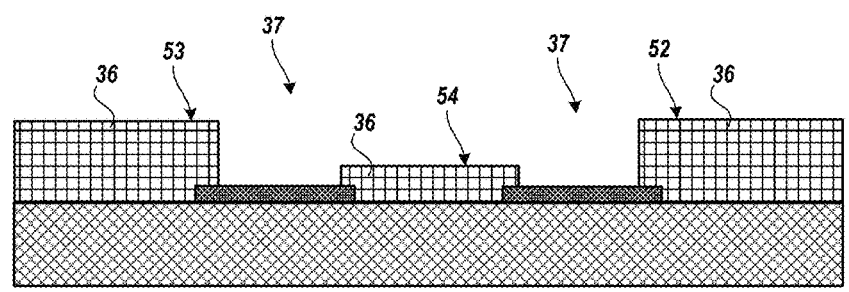
FIG. 15 depicts a cross section view of an exemplary semiconductor package solder mask and exposed contacts, according to various embodiments of the present invention.

FIG. 15 depicts a cross section view of an exemplary semiconductor package solder mask 36 and IO contacts exposed by openings 37 within the solder mask 36. In an embodiment, a portion of the solder mask 36 may be removed between neighboring openings 37. For example, the portion of the solder mask 36 may be removed between neighboring openings 37 by laser ablation or other known technique such that a top surface 54 of solder mask 36 between neighboring openings 37 is below a major top surface 53 of solder mask 36. The term "major top surface" is defined as the top surface of the majority of the solder mask 36. The dimensions of a depression formed by the removal of solder mask 36 material between neighboring openings 37 may be such that the multi terminal capacitor 50 fits within the depression while allowing the terminals of the multi terminal capacitor 50 to be electrically connected to respective IO contacts via reflowed solder 34. In an embodiment, as is depicted, top surface 54 is above a top surface of one or more IO contacts. In other embodiments, top surface 54 is coplanar with the top surface of one or more IO contacts. In other embodiments, top surface 54 is below the top surface of one or more IO contacts.

Figure 16:
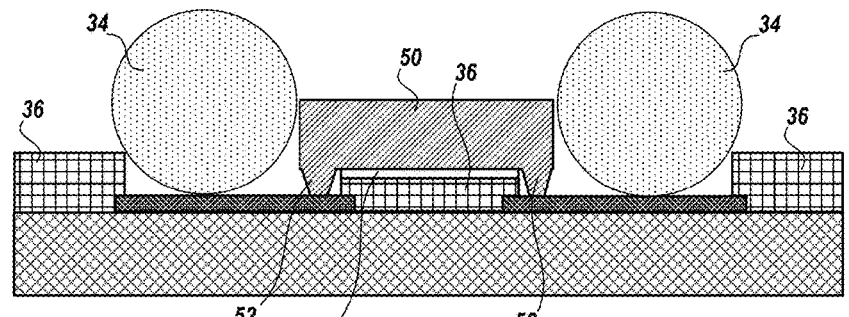
FIG. 16 depicts a cross section view of an exemplary multi terminal capacitor upon semiconductor package exposed contacts, according to various embodiments of the present invention.

FIG. 16 depicts a cross section view of an exemplary multi terminal capacitor 50 upon exposed IO contacts of a semiconductor package. In an embodiment, the multi terminal capacitor 50 may be mechanically attached to the semiconductor package via adhesive 60. In a particular implementation, the adhesive 60 may be arranged so as to be between multi terminal capacitor 50 and surface 54 of solder mask 36, as is shown in FIG. 16. In another implementation, the adhesive 60 may be arranged so as to be between one or more terminals of multi terminal capacitor 50 and respective IO contact(s). In an embodiment, as is depicted, top surface of adhesive 60 is above a top surface of one or more IO contacts. In other embodiments, top surface of adhesive 60 is coplanar with the top surface of one or more IO contacts.

In some embodiments, the multi terminal capacitor 50 may prevent solder 34 from bridging between neighboring IO contacts during solder 34 reflow. Post solder 34 reflow, solder 34 electrically connects a terminal 52 of multi terminal capacitor 50 with an IO contact of a first semiconductor package and an IO contact of a second semiconductor package (not shown). For example, the reflowed solder 34 wets to side surfaces of terminal 52 of the multi terminal capacitor 50, an adjacent IO contact of the first semiconductor package, and an aligned IO contact of the second semiconductor package. In a particular implementation, as is shown in FIG. 16, the bottom surface is directly connected to the adjacent IO contact. As a result, post solder 34 reflow, there is no inductance between the terminal 52 and solder 34, no inductance between terminal 52 and the adjacent IO contact of the first semiconductor package, and no inductance between solder 34 and the aligned IO contact of the second semiconductor package. In an embodiment, the top perspective view and side perspective view of multi terminal capacitor 50 is generally rectangular. As such, terminals 52 need not protrude from the body of the capacitor 50. Generally, terminal 52 multi terminal capacitor 50 are the features of the capacitor that electrically connects to one or more internal plates of the multi terminal capacitor 50 and provides a surface to make electrical connection between another discreet electrical component and the multi terminal capacitor 50. For example, a first terminal 52 of multi terminal capacitor 50 electrically connects to one or more first sets of internal plates of the multi terminal capacitor 50 and a second terminal 52 of multi terminal capacitor 50 electrically connects to one or more second sets of internal plates of the multi terminal capacitor 50, such that a capacitance is formed across the first sets of internal plates and the second sets of internal plates when current flows between the first and second terminals.

Figure 17:
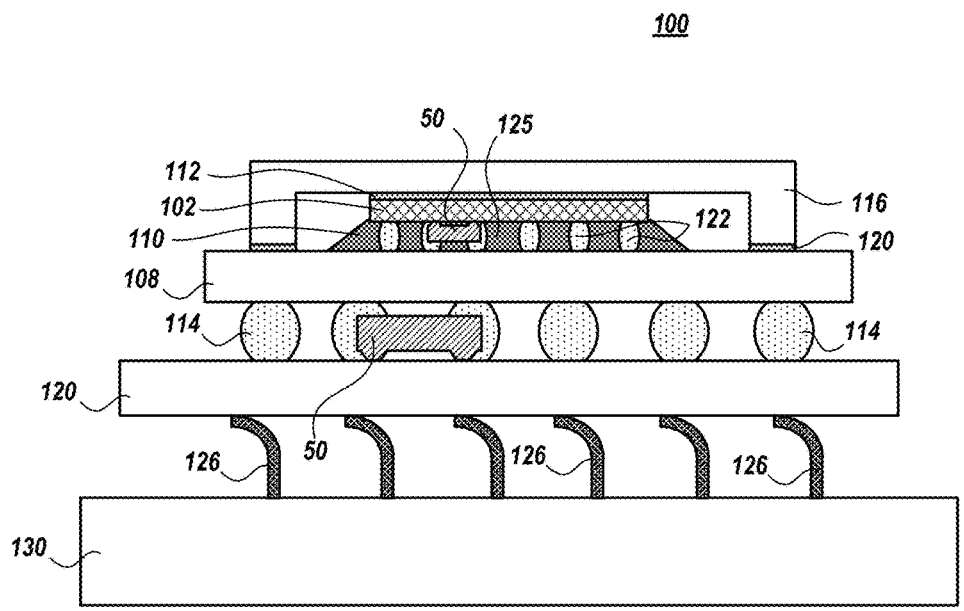
FIG. 17 depicts a cross section view of an exemplary semiconductor chip system of an electronic device which includes a multi terminal capacitor within an IO path of a multi semiconductor package interconnect, according to various embodiments of the present invention.

FIG. 17 depicts a cross section view of an exemplary semiconductor chip system 100 of an electronic device such as a computer, server, mobile device, tablet, etc. which includes a multi terminal capacitor 50 within an IO path of a multi semiconductor package interconnect. Semiconductor chip system 100 includes multiple semiconductor packages. For example, chip system 100 includes a semiconductor chip 102, chip carrier 108, carrier interposer 120, and motherboard 130. Semiconductor chip 102 may be a processor, integrated circuit, semiconductor chip, microchip or the like. Chip carrier 108 may be an organic or inorganic carrier, interposer, or the like that is electrically connected to semiconductor chip 102 via interconnects 122. Carrier interposer 120 may be an organic or inorganic carrier, interposer, or the like that is electrically connected to chip carrier 108 via interconnects 114. Motherboard 130 may be a system board, printed circuit board, or the like that is electrically connected to carrier interposer 120 via interconnects 126.

Chip carrier 108 provides mechanical support for the semiconductor chip 102 and electrical paths from IO contacts upon the upper surface of carrier 108 to IO contacts on the opposing side of carrier 108. Carrier interposer 120 provides mechanical support for the chip carrier 108 and electrical paths from IO contacts on the upper surface of carrier interposer 120 to IO contacts on the opposing side of carrier interposer 120.

Interconnects 122 connect semiconductor chip 102 to the upper side of chip carrier 108 and may be a C4 type solder array, or the like that electrically connect semiconductor chip 102 to IO contact array upon the top side of chip carrier 108 subsequent to a solder reflow. A multi terminal capacitor 50 may be located within the first interconnect level (e.g., directly upon semiconductor chip 102 or the top side of chip carrier 108). If located upon the chip carrier 108, the reflowed solder also electrically connects a terminal of the multi terminal capacitor 50 to an IO contact of the chip carrier 108. If located upon semiconductor chip 102, the reflowed solder also electrically connects a terminal of the multi terminal capacitor 50 to an IO contact of the semiconductor chip. In this manner, the terminal capacitor 50 is within an IO path of an interconnect 122. The terminal of the multi terminal capacitor 50 is electrically connected within the IO path such that there is no inductance between the terminal and an IO contact of either the semiconductor chip 102 or chip carrier 108 and between the terminal and the reflowed solder.

Underfill 110 may be electrically-insulating and may substantially surround interconnects 122, thereby electrically isolating individual interconnects, and may provide mechanical support between the associated semiconductor chip 102 and chip carrier 108. Underfill 110 may also prevent damage to individual interconnects 122 due to thermal expansion mismatches between the semiconductor chip 102 and chip carrier 108. A lid 116 may be attached to semiconductor chip 102 with an interface material 112 and to chip carrier 108 with a seal band 120.

The seal band 120 may be applied to the chip carrier 108 around the perimeter of the semiconductor chip 102. During operation of the electronic device, heat may need to be removed from semiconductor chip 102. In this situation, lid 116 may be both a cover and a conduit for heat transfer. As such, a thermal interface material (TIM) may thermally join lid 116 and semiconductor chip 102. TIM may be a thermal grease, gel, or other similar compliant heat transferring material and may be applied upon semiconductor chip 102 or upon aligned locations on the underside of cover 116.

At the second interconnect level, interconnects 114 are micro BGA type solder balls. Generally, size of interconnects 114 are greater than the size of interconnects 122, and as such, the size of multiple capacitor 50 in the second interconnect level may be larger than the size of any multiple capacitor 50.

Interconnects 122 connect chip carrier 108 to the upper side of carrier interposer 120 and electrically connect IO contacts upon the bottom side of carrier 108 with IO contacts upon the top side of carrier interposer 120 subsequent to a solder reflow. A multi terminal capacitor 50 may be located within the second interconnect level (e.g., directly upon the underside of chip carrier 108 or the top side of carrier interposer 120). If located upon the underside of chip carrier 108, the reflowed solder also electrically connects a terminal of the multi terminal capacitor 50 to an IO contact of the chip carrier 108. If located upon carrier interposer 120, the reflowed solder also electrically connects a terminal of the multi terminal capacitor 50 to an IO contact of the carrier interposer 120. In this manner, the terminal capacitor 50 is within an IO path of an interconnect 114. The terminal of the multi terminal capacitor 50 is electrically connected within the IO path such that there is no inductance between the terminal and an IO contact of either the carrier interposer 120 or chip carrier 108 and between the terminal and the reflowed solder.

Carrier interposer 120 is connected to motherboard 130 via interconnects 126. Interconnects 123 may be a pin array located upon motherboard 130 or may be a pin array located upon carrier interposer 120. In other embodiments, interconnects 126 may be a wire bond, solder bond, stud, pin, conductive ball, conductive button, etc.

For clarity, one or more multi terminal capacitor(s) 50 may be located within the first interconnect level and/or one or more multi terminal capacitor(s) 50 may be located within the second interconnect level.

Figure 18:
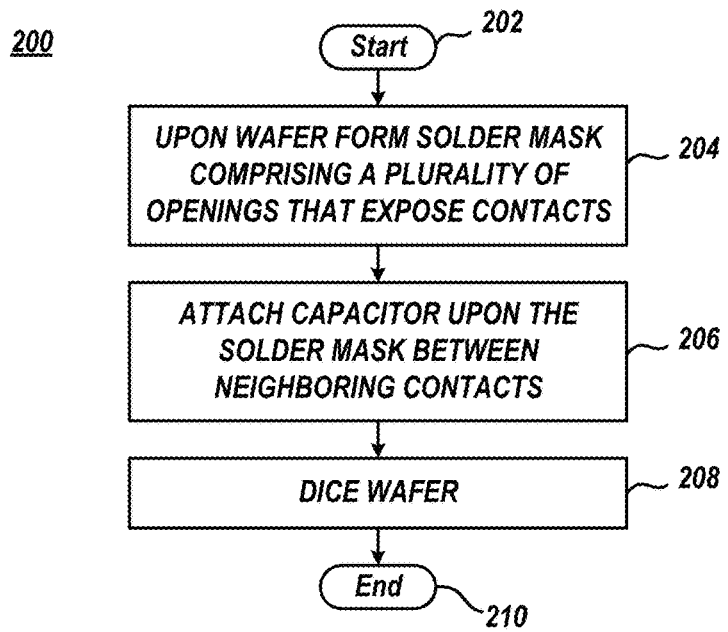
FIG. 18-FIG. 21 depict exemplary semiconductor package fabrication methods, according to embodiments of the invention.

FIG. 18 depicts an exemplary semiconductor package fabrication method 200. Method 200 may be utilized to fabricate a first semiconductor package in the form of a wafer. Method 200 begins at block 202 and continues with forming a solder mask 36 comprising a plurality of openings 37 therewithin upon a wafer comprising a plurality of IO contacts such that respective openings 37 expose respective IO contacts (block 204).

Method 206 may continue with attaching a multi terminal capacitor 50 upon the solder mask 36 between neighboring IO contacts such that a first terminal 52 contacts a first IO contact and a second terminal 52 contacts a second IO contact which neighbors the first IO contact (block 206). For example, the multi terminal capacitor 50 may be attached to the wafer by an adhesive. In some embodiments, method 200 may also include forming solder 34 upon the exposed IO contacts. A first solder 34 may be located upon the first IO contact adjacent to the first terminal 52 and a second solder 24 may be located upon the second IO contact adjacent to the second terminal 52. Method 200 may continue with dicing the wafer (block 208) and ends at block 210.

Figure 19:
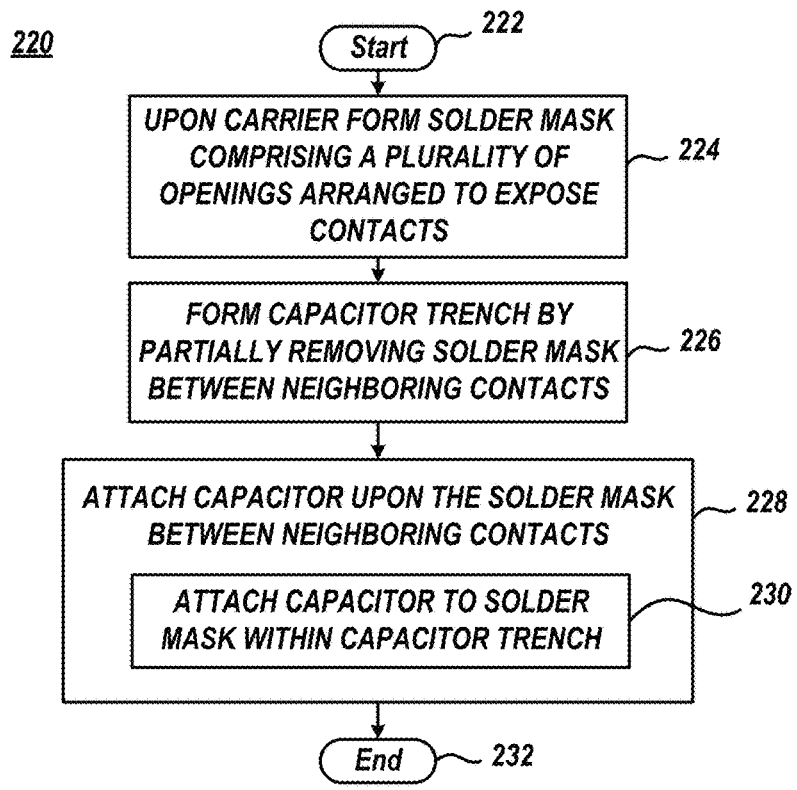

FIG. 19 depicts an exemplary semiconductor package fabrication method 220. Method 220 may be utilized to fabricate a semiconductor chip carrier 108. Method 220 begins at block 222 and continues with forming a solder mask 36 comprising a plurality of openings 37 therewithin upon a semiconductor chip carrier 108 comprising a plurality of IO contacts such that respective openings 37 expose respective IO contacts (block 24).

Method 220 may continue with forming a capacitor trench by partially removing solder mask 36 material between neighboring IO contacts (block 226). For example, the portion of the solder mask 36 may be removed between neighboring openings 37 by laser ablation or other known technique such that a top surface 54 of solder mask 36 between neighboring openings 37 is below a major top surface 52 of solder mask 36. The dimensions of a trench formed by the removal of solder mask 36 material between neighboring openings 37 may be such that the multi terminal capacitor 50 fits within the trench.

Method 220 may continue with attaching multi terminal capacitor 50 upon solder mask 36 between neighboring IO contacts such that a first terminal 52 contacts a first IO contact and a second terminal 52 contacts a second IO contact which neighbors the first IO contact (block 228). For example, the multi terminal capacitor 50 may be mechanically attached to solder mask 36 within the trench (block 230) via adhesive 60. In a particular implementation, the adhesive 60 may be arranged so as to be between multi terminal capacitor 50 and surface 54 of solder mask 36. In another implementation, the adhesive 60 may be arranged so as to be between one or more terminals 52 of multi terminal capacitor 50 and respective IO contact(s).

In some embodiments, method 220 may also include forming solder 34 upon the exposed IO contacts. For example, a first solder 34 may be located upon the first IO contact adjacent to the first terminal 52 and a second solder 24 may be located upon the second IO contact adjacent to the second terminal 52. Method 220 ends at block 232.

Figure 20:
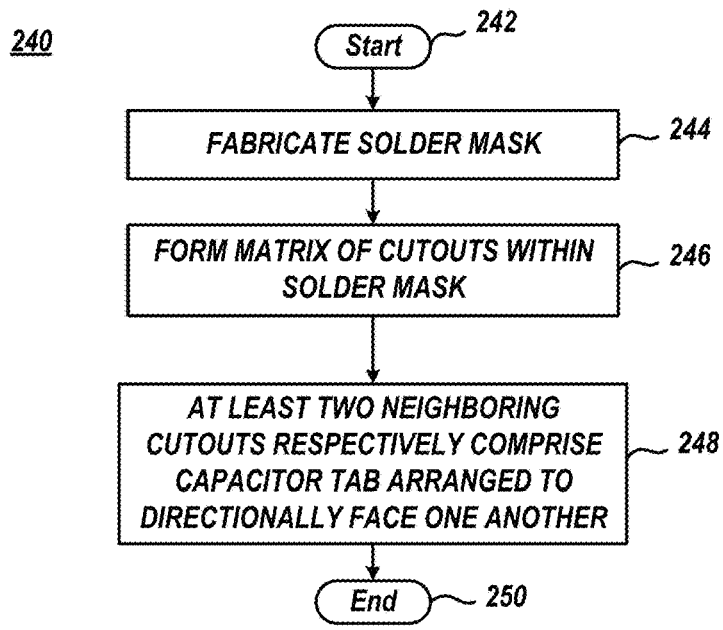
Figure 21:
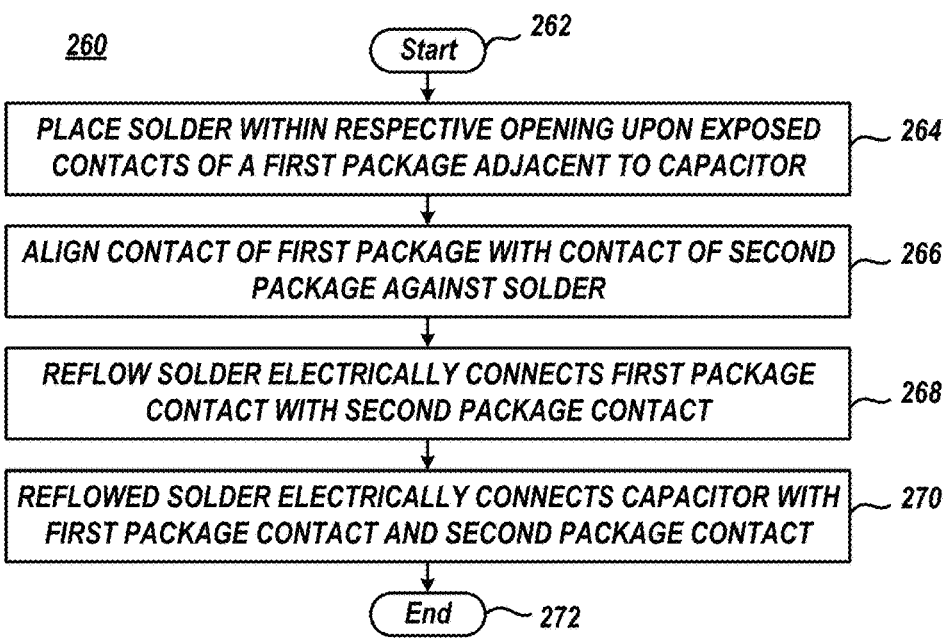

FIG. 20 depicts an exemplary semiconductor package fabrication method 240. Method 240 may be utilized to fabricate solder mask 36. Method 240 begins at block 222 and continues with fabricating a solder mask 36 upon a semiconductor package (block 244). For example, the solder mask 36 may be formed upon a wafer, semiconductor chip 102, semiconductor chip carrier 108, or the like.

Method 240 may continue with forming an array of openings 37 within solder mask 36 to expose respective IO contacts of the semiconductor package (block 246). For example, a solder mask 36 may be positively applied on only particular locations of the semiconductor package such that openings 37 exist within the mask 36 utilizing positive deposition techniques. In other example, a solder mask 36 may be applied and portions of the solder mask 36 may be removed to form openings 37 utilizing subtractive (e.g. etching, etc.) fabrication techniques.

Method 240 may continue with forming respective capacitor tabs 40 associated with neighboring openings 37 such that the capacitor tabs 40 directionally extend toward one another (block 248). Method 240 may further include forming a signal tab 41 associated with opening 37 such that the signal tab 41 extends in an opposite direction from the capacitor tab 40 of the opening 37. Method 240 ends at block 250.

FIG. 20 depicts an exemplary semiconductor package fabrication method 260. Method 260 may be utilized to fabricate a multi semiconductor package. For example, method 260 may be utilized to fabricate a semiconductor chip 102 and chip carrier 108 package or a chip carrier 108 and carrier interposer 120 package. Method 260 begins at block 262 and continues with placing solder 34 within an opening 37 and upon an IO contact of a first semiconductor package adjacent to a terminal 52 of a multi terminal capacitor 50 (block 264).

Method 260 may continue with aligning the IO contact of the first semiconductor package with an IO contact of a second semiconductor package against solder 34 (block 266). Method 260 may continue with reflowing solder 34 to electrically connect the first semiconductor package with the second conductor package (block 268). Further, the reflowed solder also electrically connects the terminal 52 with an IO contact (block 270). No additional inductance is introduced in the multi semiconductor package of method 260 due to the addition of multi terminal capacitor 50 within the solder 34 IO pathway. For example, the inductance between IO contacts of the first package and the IO contacts of the second package are the same whether or not the multi terminal capacitor 50 is therein. Further, there is no inductance between the terminal 52 of multi terminal capacitor 50 and the IO contact and there is no inductance between terminal 52 and solder 34. Method 260 ends at block 272.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of mother board 130, regardless of the actual spatial orientation of the mother board 130. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A semiconductor chip system comprising:
   a semiconductor chip electrically connected to a chip carrier via first input output (IO) interconnects within a first interconnect level between a bottom surface of the semiconductor chip and an upper surface of the chip carrier;
   a carrier interposer electrically connected to the chip carrier via second IO interconnects within a second interconnect level between a bottom surface of the chip carrier and an upper surface of the carrier interposer and electrically connected to a mother board via third IO interconnects within a third interconnect level between a bottom surface of the carrier interposer and an upper surface of the mother board;
   a multi terminal capacitor within the second interconnect level such that there is no inductance between a first solder interconnect within the second interconnect level and a first terminal of the multi terminal capacitor and between the first solder interconnect and a first IO contact of the chip carrier and such that there is no inductance between a second solder interconnect within the second interconnect level and a second terminal of the multi terminal capacitor and between the second solder interconnect and a second IO contact of the chip carrier, wherein the second IO contact of the chip carrier diagonally neighbors the first IO contact of the chip carrier.

2. The semiconductor chip system of claim 1, wherein the multi terminal capacitor is attached to an underside of the chip carrier.

3. The semiconductor chip system of claim 1, wherein the multi terminal capacitor is attached to a topside of the carrier interposer.

4. The semiconductor chip system of claim 1, wherein the multi terminal capacitor comprises two terminals.

5. The semiconductor chip system of claim 1, wherein the multi terminal capacitor comprises four terminals.

6. A semiconductor chip system comprising:
   a semiconductor chip electrically connected to a chip carrier via first input output (IO) interconnects within a first interconnect level between a bottom surface of the semiconductor chip and an upper surface of the chip carrier;
   a carrier interposer electrically connected to the chip carrier via second IO interconnects within a second interconnect level between a bottom surface of the chip carrier and an upper surface of the carrier interposer and electrically connected to a mother board via third IO interconnects within a third interconnect level between a bottom surface of the carrier interposer and an upper surface of the mother board;
   a multi terminal capacitor within the second interconnect level such that there is no inductance between a first solder interconnect within the second interconnect level and a first terminal of the multi terminal capacitor and between the first solder interconnect and a first IO contact of the carrier interposer and such that there is no inductance between a second solder interconnect within the second interconnect level and a second terminal of the multi terminal capacitor and between the second solder interconnect and a second IO contact of the carrier interposer, wherein the second IO contact of the carrier interposer diagonally neighbors the first IO contact of the carrier interposer.

7. The semiconductor chip system of claim 6, wherein the multi terminal capacitor is attached to an underside of the chip carrier.

8. The semiconductor chip system of claim 6, wherein the multi terminal capacitor is attached to a topside of the carrier interposer.

9. The semiconductor chip system of claim 6, wherein the multi terminal capacitor comprises two terminals.

10. The semiconductor chip system of claim 6, wherein the multi terminal capacitor comprises four terminals.

* * * * *